United States Patent
Meyer et al.

(10) Patent No.: US 6,865,081 B2
(45) Date of Patent: Mar. 8, 2005

(54) MICROSTRUCTURE COOLER AND USE THEREOF

(75) Inventors: Heinrich Meyer, Berlin (DE); Konrad Cramer, Berlin (DE); Olaf Kurtz, Berlin (DE); Peter Prechtl, Munich (DE); Sven Theisen, Starnberg (DE); Markus Hohn, Oberhaching (DE); Ralph Herber, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 142 days.

(21) Appl. No.: 10/394,356

(22) Filed: Mar. 21, 2003

(65) Prior Publication Data

US 2004/0066625 A1 Apr. 8, 2004

(30) Foreign Application Priority Data

Oct. 2, 2002 (DE) ........................................ 102 46 990

(51) Int. Cl.$^7$ ................................................ H05K 7/20
(52) U.S. Cl. ...................... 361/699; 361/700; 174/15.1; 174/15.2; 165/80.4; 165/104.26; 257/714; 257/715
(58) Field of Search ......................... 361/689, 698–700, 361/711; 257/714, 715; 174/15.1, 15.2; 165/80.4, 104.26

(56) References Cited

U.S. PATENT DOCUMENTS

| | | | |
|---|---|---|---|
| 4,516,632 A | | 5/1985 | Swift et al. |
| 5,099,311 A | * | 3/1992 | Bonde et al. ............... 165/80.4 |
| 5,423,376 A | | 6/1995 | Julien et al. ............... 165/80.4 |
| 5,527,588 A | * | 6/1996 | Camarda et al. ............ 428/188 |
| 5,697,428 A | * | 12/1997 | Akachi .................. 165/104.21 |
| 5,727,618 A | * | 3/1998 | Mundinger et al. ......... 165/80.4 |
| 5,835,345 A | * | 11/1998 | Staskus et al. .............. 361/699 |
| 5,901,037 A | * | 5/1999 | Hamilton et al. ........... 361/699 |
| 6,101,715 A | * | 8/2000 | Fuesser et al. ........... 29/890.03 |
| 6,167,948 B1 | * | 1/2001 | Thomas .................. 165/104.26 |
| 6,301,109 B1 | * | 10/2001 | Chu et al. .................... 361/690 |
| 6,480,385 B2 | * | 11/2002 | Seshan ........................ 361/704 |
| 6,578,626 B1 | * | 6/2003 | Calaman et al. ........... 165/80.4 |
| 6,661,658 B2 | * | 12/2003 | Capriz et al. ............... 361/690 |
| 2002/0056542 A1 | * | 5/2002 | Yamamoto et al. ......... 165/80.3 |

FOREIGN PATENT DOCUMENTS

| | | |
|---|---|---|
| DE | 198 53 750 | 2/2000 |
| EP | 1 113 496 | 7/2001 |
| FR | 2 748 800 | 5/1996 |
| WO | WO 98/41076 | 9/1998 |

OTHER PUBLICATIONS

Chip, Oct. 2002, p. 48.

* cited by examiner

Primary Examiner—Boris Chervinsky
(74) Attorney, Agent, or Firm—Paul & Paul

(57) ABSTRACT

The invention relates to a microstructure cooler 3 for an article 4 to be cooled, whereby the cooler 3 includes a stack of at least two metal films 1 and one base plate 5 that can be brought via a thermal contact surface 6 into thermal contact with the article 4, the metal films 1 and the base plate 5 are joined to one another in a material fit, present in the metal films 1 are channels 2 for cooling medium, and the channels 2 have a width in the range of 100 to 2,000 $\mu$m, a depth in the range of 25 to 1,000 $\mu$m, and a mean interval in the range of 50 to 1,000, residual film thicknesses resulting from the channels 2 in the metal films 1 are in the range of 50 to 300 $\mu$m, and the base plate 5 has a thickness in the range of 200 to 2,000 $\mu$m.

24 Claims, 6 Drawing Sheets

MICROSTRUCTURE COOLER AND USE THEREOF

Figure 1:
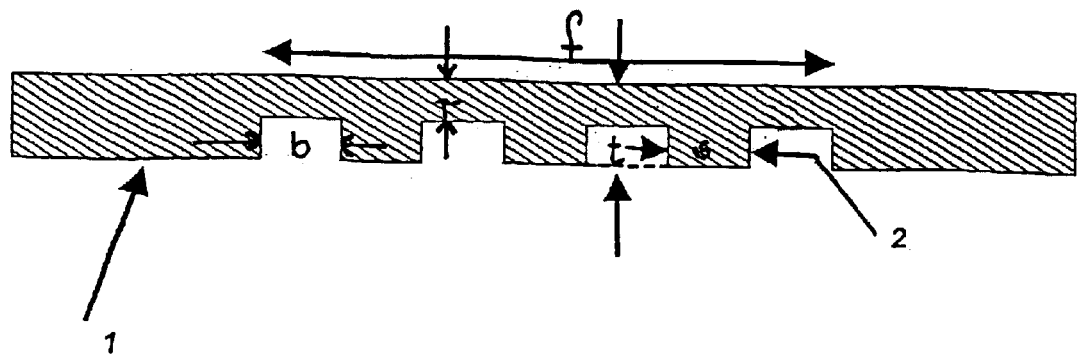

The invention relates to a cooler that is characterized by microstructures (microstructure cooler) and that is used for cooling articles by heat-conducting contact. The invention relates in particular to use of the microstructure cooler for cooling electronic elements, in particular processors such as central processing units (CPUs) and elements of power electronics. With regard to manufacturing process, the microstructured cooler in accordance with the invention is suitable for mass production in terms of design, structure, and joining method and thus the microstructure cooler can be manufactured economically in large numbers.

The continuous increase in the capacity of electronic components, for instance the increase in dock frequencies in microprocessors, also entails increased heat in is these components. Component miniaturization further exacerbates this situation. Thermal problems increase, although measures are undertaken to reduce the amount of heat the processors give off. In addition, the increasing packing density of the individual components inside the overall system, such as a server, leads to a situation in which more and more heat must be removed from smaller and smaller spaces. However, the performance and service life of electronic components depend on the maximum values for operating temperature and their fluctuation range. This results in the need to use very high-performance, compact cooling systems in order to assure efficient local heat removal.

Currently a modem processor releases for instance 70 Watts in the form of heat on an area of 1 $cm^2$; this is substantially more heat than a heating element on a kitchen range produces (~10 $Watts/cm^2$). In order to remove this quantity of heat, the most important cooling systems used are cooling bodies, fans, combined with cooling bodies, heat pipes, Peltier units, and liquid cooling. It is to be expected that the amounts of heat to be removed in the future will increase even more.

Currently the most frequently used cooling technique for electronic elements is cooling with ambient air. This has proved simple and cost-effective for many applications. This principle is extremely uneconomical for higher heat removal capacities since then air conditioning systems with correspondingly high output are required, which not only drives up capital expenditures and operating costs, but also is problematic in terms of energy and environmental policies.

With the new generation of processors, which generate a great deal of heat, air cooling is also pushing its limits in terms of capacity. Heat removal can still generally be assured by increasing fan power, but this causes an increase in running noise. Today 55 dB is no longer acceptable in commercial and household applications.

The high packing density for processors and other heat-generating components in the smallest possible space, such as for instance in servers, makes air exchange in the housings more difficult, exacerbates the problem of heat concentration, and thus leads to an increased risk of electronic components overheating and failing. However, reliability and low-maintenance requirements are primary performance considerations for servers and workstations. In addition, CPUs that operate in the Gigahertz range and electrically operated fans can have reciprocal electromagnetic effects that lead to functional problems with the CPU.

In order to improve the cooling efficiency of the air, elements that develop a high amount of heat must generally be provided with cooling bodies. The cooling bodies generally comprise a massive metal core or a metal plate made of copper or aluminum, the top side of which is characterized for instance by a multi-member structure for surface area enlargement and therefore for better heat distribution. A fan can be mounted on the cooling body. The layout of such cooling systems is only somewhat adaptable in terms of geometry due to the space required and the weight, and furthermore is associated with loud running noise, typically between 40 and 60 dB (c't, 18, p. 122, 2002). The same article mentions a relatively small ΔT between 30 and 40° C., measured between the maximum CPU temperature and the maximum interior PC temperature in the tested air coolers. For these reasons it is frequently necessary to compromise when using air coolers, which entails both technical and economic disadvantages.

Heat pipes have been commercially available since the 1960's and for the past several years have been increasingly used as high-end cooling systems for the electronics industry. Heat pipes are formed by a passive, closed cooling system with which very good heat transfer is attained by a two-phase mechanism in the cooling medium. The heat absorption from the electronic element to be cooled leads to evaporation of the cooling medium in the closed system; the cooling medium then moves through the so-called adiabatic intermediate space in the condensation portion of the heat pipe. There the heat is removed by an additional heat sink. The condensate forms and is then returned to the evaporation area via a mesoporous edge layer. Setting this two-phase mechanism is only possible in a very limited temperature range with specific cooling media and severely restricts the options for employing heat pipes. In addition, the cooling capacity of these systems in comparison to water cooling, for instance, is low.

Peltier cooling units are used as heat pumps for instance in electronics, in air conditioning technology, and in medical and laboratory engineering. They are very compact, but they are very expensive and as a rule are not suitable when substantial quantities of heat are to be eliminated locally and cost-effectively. Peltier cooling units furthermore require heat sinks for counter-cooling and an electrical power unit for the power supply. Energy consumption is increased by the amount of additional energy required. For this reason the power requirement of these units is high relative to cooling capacity, so that their use in mass applications is uneconomical.

Water cooling systems made of metal or ceramic materials have the highest cooling capacity in direct comparison to the cooling systems cited above. This is primarily due to the high heat capacity of the water and its low viscosity. Thus recently water coolers made of copper, aluminum, and ceramics for cooling microprocessors have been on the market. All of these products today are subject to the high manufacturing costs of non-industrial small batch production. Typical performance data and prices for conventional coolers available on the market are at best for a temperature difference ΔT between CPU and cooling water inlet ($T_{CPU}$ − $T_{cooling\ water\ inlet}$) of 12.5 to 16° C. under full load with a cooling medium flow quantity of 3 L/min, for instance with an AMD 2000+, with a flow quantity of 1–20 L/min, with a pressure loss of 25 to max. 250 mbar, with a weight of approx. 200–400 g, with component volume between 30 and 100 $cm^3$ and with a current price of 50–100 Euros. The coolers are designed for the use of aquarium pumps with typical pump capacity of 1—3 L/min at a pressure loss of 130–140 mbar.

The Innovatik Company currently sells water coolers, and the innovaCOOL rev 3.0 model is presently assessed to have the best performance of any coolers available on the market at a price of —80 Euros (e.g. Chip, October 2002, p. 48).

The performance data for the innovacool rev3.0 and an optimized microstructured cooler in Design B as an example (see Appendix) are summarized in the following table:

|  | InnovaCOOL rev3.0 | Inventive cooler (Design B example) |
|---|---|---|
| Weight | 312 g | 80 g |
| Volume | 80 cm$^3$ | 8 cm$^3$ |
| ΔT | 12.5 K | 9.4 K |
| Flow quantity | 2.8 L/min. | 1.5 L/min. |
| Cooling medium | Water/glycol 95%/5% | |

The comparison tests were conducted under identical conditions for cooling an AMD 2000+ CPU.

For coolers for power semiconductors there have been initial attempts to use channel cross-sections smaller than 1 mm$^2$, as is the case for microheat exchangers and microreactors, as well.

"Innovative Chip-Level Cooling", J. Schulz-Harder, in PCIM Europe, March 2002, pages 27–42, describes a water cooling system for power semiconductor circuits. The cooler is produced from copper layers and joined to the semiconductor carrier with the ceramic layers using a soldering process by means of eutectic melt. For manufacturing the cooler, the cooling channels in the copper layers are produced by etching as for manufacturing printed circuit boards. A cooling body through which a liquid flows is formed that has in its interior structure 8 to 10 copper layers with a hexagonal base structure (thickness of each layer is 0.3 mm) and columns with a diameter of 1.5 mm. It is assumed that a heat quantity of 400 Watt/cm$^2$ can be removed. At a flow quantity of 5 L of water per minute, a pressure loss of 640 mbar results. It is clear from this description that this is an expensive high-performance component.

Furthermore, WO 98/41076 A2 describes an apparatus for cooling electronic elements in which capacity can be raised substantially, compared to known coolers, by a heat sink and the heat transfer coefficient and thus the total thermal conductivity are to be substantially improved. In this document it is assumed that the largest pressure loss that the cooling fluid produces when passing through the microstructured heat sink occurs in the area of the distribution structures and connecting channels. In order to solve this problem, a cooler is suggested that has a plurality of individual layers and that comprises at least one plate with numerous microchannels and one distribution channel and that furthermore has an intermediate plate with connecting channels and a collection plate with collection channels, whereby closed cooling channels result when these plates have been provided together with a cover plate and a base plate. The cooling medium in the cooling channels is introduced through an inlet opening into the microstucture heat sink and removed from it through an exit opening. The intermediate plate for the cooling medium forms a graded and/or beveled transition structure, through which cross-sectional surface areas of the inlet and/or outlet opening, each of which is a vertical cut to the surface through all individual layers, successively transitions to the cross-sectional surface of the microchannels. A cooler with cooling channels with a flow cross-section of 0.3 mm×10 mm is cited as an example. In this cooler, a heat transfer coefficient of 8.5 Watts/cm$^2$·K and a pressure loss of 0.5 bar at a flow of 500 L/min is attained, for example. With these performance data, this relatively expensive cooler attains only approximately 10% of the cooling capacity required for the average CPU.

In contrast to microreactors and micro-heat exchangers that are already employed in research and development projects and even in initial industrial processes, the problem of the layout of electronic coolers is sill completely unresolved since "heat management" in a microreactor or micro-heat exchanger is fundamentally different from that in a cooler that has to remove heat from a surface area.

In a reactor, heat that occurs in a flowing medium, that is, inside the reactor, must be removed or exchanged as rapidly as possible in order to come as dose as possible to the ideal of an isothermal process. For this reason, attempts are being made within process engineering limits of a reaction to keep the cross-sections of the channels and the wall thickness between the channels as small as possible. Naturally a reactor must also be optimized in terms of layout, e.g., with respect to flow resistance, flow rate, etc.; but the fundamental heat management principle is relatively simple.

For instance, it has been reported that microstructure components can be manufactured from individual thin metal sheets (films) that have a fine structure, the microstructure (see U.S. Pat. No. 4,516,632, for instance). In contrast, in a cooler for electronic components the heat must be removed from a strong, local exterior heat source.

Upon closer inspection, this object, i.e., removing heat from a local highly heated surface, proves to be a very complex problem. The difficulty is that the actual heat source is located outside of the cooler, that is, much more attention must be given to the heat resistances within the three-dimensional structure of the cooling body through which the fluid flows.

The solution to the problem is now further complicated by additional specific requirements in electronics (for instance, when cooling CPU elements) in that the heat must be removed with a minimum requirement for cooling water and a minimum pressure loss in the cooler.

It has been found, that is, that increasing the cooling capacity by using increasingly fine structures, that is, smaller channel cross-sections, is only possible in a limited fashion since then the flow resistance rises too high.

This effect always becomes a problem when a large quantity of heat is to be removed via a small surface area without the flow resistance increasing too much. In this case, then, the cooling capacity cannot simply be increased in that the flow speed of the cooling medium is increased by higher pressure difference, as is the custom in the prior art.

For application in PCs, servers, and workstations, low pressure pumps are typically used that produce, for instance, a pressure of up to approx. 250 mbar. Powerful cooling medium pump systems for conventional microreactors that work under elevated initial pressure, for instance 5 bar and more, are not acceptable in this case due to the cost.

Another requirement is that the cooler have a shape adapted to the shape of the electronic element, that is, the surface area of the cooler and the mounting area on the element should be the same size.

Finally, for the purposes of mass production, it must be ensured that the manufacturing costs for the fluid cooler and the cooling system are not substantially higher than for air cooling.

In summary, it can be said that the prior art does not satisfy these requirements, or only partially satisfies them. This relates in particular to the requirement for cost-effective mass production for microstructure components and reducing the high flow resistances in these components. Apart from this, there are no rules for the design or layout of microstructure coolers.

The object of the present invention is therefore:
1. first to provide fundamental rules and features, i.e., specific geometric data for the optimal layout and design of microstructured cooling bodies for uniplanar local heat sources, and
2. to resolve the special additional problems that are associated with cooling microprocessors (CPUs) and other hot components of electronic computers; in particular, the issues of flow resistance and pressure loss, which heretofore have remained unresolved, are to be resolved. In addition, the layout of the cooler should be largely scalable, that is, should be adaptable to the requirements at hand in a simple fashion. Thus power consumption should increase from 70 Watts/$cm^2$ to 500 Watts/$cm^2$ and the cooler should be optimally adaptable to the overall system in terms of layout, size, volume, assembly, etc.

The foregoing objects are achieved by the microstructure cooler in accordance with Claim 1 and by the use of the microstructure cooler in accordance with Claim 24. Preferred embodiments of the invention are provided in the subordinate Claims.

The cooler, in particular for an electronic component, includes a stack of at least two metal films (metal sheets) and one base plate that can be brought via a thermal contact surface into thermal contact with the article to be cooled. The metal films and the base plate are joined to one another in a material fit by suitable joining techniques, preferably soldering. Present in the metal films are channels in which flows the cooling medium that removes the heat.

The channels in the metal films have a width in the range of 100 to 2,000 $\mu$m, preferably in the range of 200 to 500 $\mu$m. In experiments it could be proven that, when all other parameters were maintained, conductivity decreases sharply starting at a channel width of 800 $\mu$m and greater and is no longer advantageous for high performance applications. The channel depth is in the range of 25 to 1,000 $\mu$m, preferably in the range of 50 to 400 $\mu$m. At least one of the two geometric variables, channel width or channel depth, should preferably be in the micrometer range, and the hydraulic diameter 4·A/U; A=cross-sectional area, U=perimeter (defined in accordance with: Technische Strömungslehre, Kamprath series, Vogel Publishing, W. Bohl, 11th edition, page 131; Incropera, Frank P. and Dewitt, David P., Fundamentals of Heat and Mass Transfer, 4th Edition, John Wiley & Sons, N.Y., 1996, page 449) should preferably be 200–500 $\mu$m. The mean interval between channels in a metal film is in the range of 50 to 1,000 $\mu$m, preferably in the range of 150 to 300 $\mu$m. If the cross-section of the channels is also rectangular or nearly rectangular, so that a bar is formed between the channels in the metal film, this interval is characterized as "bar width." Furthermore, the residual film thickness on the floor of the channels is in the range of 50 to 300 $\mu$m, preferably in the range of 80 to 120 $\mu$m. The base plate of the cooler has a thickness in the range of 200 to 2,000 $\mu$m, preferably in the range of 500 to 1,500 $\mu$m. For each of the foregoing parameters, the parameters particularly satisfy these requirements when they are within the preferred ranges, especially when very high power densities are required. Furthermore, the aforesaid ranges apply for the parameters in particular when Cu is used as the base material.

Figure 2:
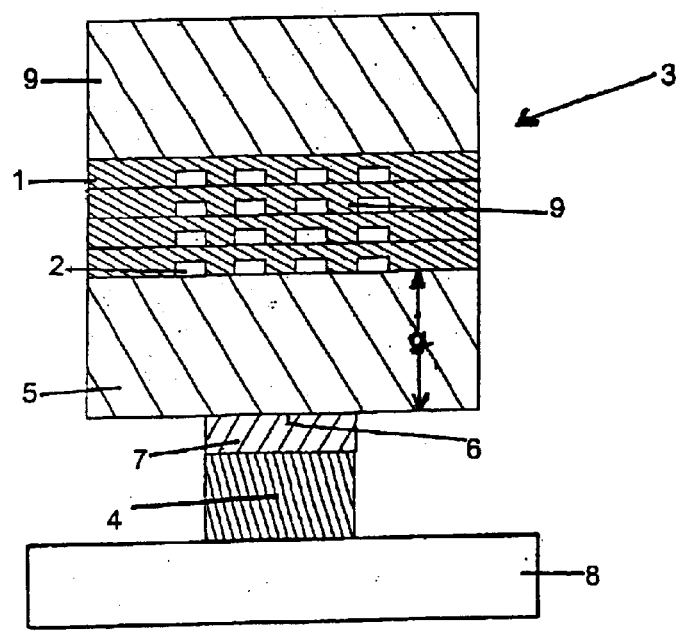

FIGS. 1 and 2 provide the definitions of the geometric parameters (channel width, channel depth, interval between channels (bar width), residual film thickness, and thickness of the base plate):

The lower range limits for channel width, channel depth, and channel interval (bar width) are largely determined by the requirements for the production process in question. When very small values are set for these geometric parameters, mass production of the cooler is difficult since the required tolerances cannot be assured. However, production options depend on the technology applied, so that the lower range limits can accommodate even lower values if product engineering is refined.

Use of microstructuring methods makes it possible to produce much finer channel structures than with conventional technology. In accordance with the invention, the term microstructure engineering means a manufacturing method in which the highly resolved structures are formed in terms of micrometers, as they can be produced in printed circuit board technology. Such methods include the production of high-resolution structure pictures, such as for instance photolithographic process steps. For instance, channels can be produced using dry etching methods or using wet chemical deep etching, depending on the masks used. Mechanical microproduction is also possible (e.g., micromilling, microstamping, reforming, etc.), whereby methods similar to those for printed circuit boards are preferred.

In that the channel width, channel depth, channel interval (bar width), residual film thickness, and base plate thickness are selected within the given ranges, it is possible to effectively reduce the pressure loss using the inventive design of the microstructure and to attain the least possible temperature difference between the article to be cooled and the cooling medium at a given cooling capacity (heat transfer capacity). A least possible temperature difference can even be attained when the cooling capacity is high. Optimizing the pressure loss in the cooler makes it possible to use pumps for feeding the cooling medium that wear less and thus attain a longer service life. In addition, only a low pump capacity is required to circulate the cooling medium, so that the costs for operating the cooling circuit can be minimized, as can the costs for the entire cooling system (cooler including counter-cooler, fluid lines, pump, power supply for the pump). This also means that the cooler can be inexpensively industrially mass-produced and that a wide spectrum of cooling capacity can be covered.

The inventive component dimensions fundamentally cannot be obtained with conventional industrial production methods for cooling systems today.

The following properties are attained with the inventive application of microstructure engineering for manufacturing the cooler:
1. Very high, reliable, absolute seal (vacuum seal up to $10^{-9}$ mbar·L/s) of the components to the environment, but also between the microchannels, for optimizing the heat transport using a complete, fully metal bond;
2. Excellent pressure resistance of the cooler and strength of the joints between the metal films and the cover and base plates;
3. Very good resistance to corrosion, adapted to the area of application, using corrosion protection layers applied electrochemically;
4. High temperature resistance;
5. Homogeneous channels that are free of deposits and that are geometrically well defined;
6. Minimal pressure loss for the cooling medium in the cooler.

The channel width, channel depth, channel interval, residual film thickness, and base plate thickness can be designed in particular with respect to the relationship between cooling capacity and volume of the microstructure cooler and can be optimized, for instance, for an AMD 2000+ CPU.

Various characteristic figures that describe the performance of a cooler can be defined.

Important factors are:

CPU power [Watts]

Power/surface area of CPU: [Watts/cm$^2$]

Characteristic line for pump delivery: Flow as function of pressure

Pressure loss in system: [mbar]

The following characteristic parameters for the cooler can be represented:

Volume of cooler (without connections): [cm$^3$]

Flow quantity of cooling medium: [L/min]

Temperature difference ΔT between CPU and cooling medium inlet:[K]

$$\Delta T = T_{CPU} - T_{cooling\ medium\ inlet}\ [K]$$

Temperature difference (for given CPU)/power: [K/Watts]

Compactness (cooling capacity/volume): [Watts/cm$^3$]

Cooling capacity per volume and ΔT: [Watts/(cm$^3$·K)]

Cooling capacity per volume and ΔT and flow: [Watts/(cm$^3$·K·L/min)]

The various parameters describe important application-relevant properties such as size, performance, efficiency, and system requirements.

For determining the characteristic figures, characteristic data calculated for a typical computer system are used. In this system, two different coolers are measured under otherwise identical conditions (PC, CPU, tube system, pump, radiator, measuring program, etc.).

Important influencing factors are:

CPU power approx. 70 Watts

Power/surface area of CPU: 60 Watts/cm$^2$

Characteristic line for pump delivery: Eheim pump

Pressure loss in system: 10–100 mbar

Example: Comparison of innovacool rev3.0 and Design A of inventive cooler

Innovacool rv3.0

Volume of cooler (without connections):

W×L×H (5×5×3.5) 87.5 cm$^3$

Flow quantity of cooling medium: 2.7 L/min

Temperature difference ΔT between CPU and cooling medium inlet:13 K $$\Delta T = T_{CPU} - T_{cooling\ medium\ inlet}\ [K]$$

Temperature difference (for given CPU)/power. 0.186 K/Watts

Compactness (cooling capacity/volume): 0.8 Watts/cm$^3$

Cooling capacity per volume and ΔT: 0.062 Watts/(cm$^3$·K)

Cooling capacity per volume and ΔT and flow: 0.023 Watts(cm$^3$·K·L/min)

Internal surface area/volume: approx. 1.13 cm$^2$cm$^3$

Inventive cooler in accordance with Design A:

The cooler is built from a base plate (thickness: 1 mm), 8 structured films, and a cover plate (thickness: 1 mm) with soldered connecting supports.

| | |
|---|---|
| Channel length: | 16 mm |
| Channel width: | 500 μm |
| Bar width: | 200 μm |
| Channel depth: | 230 μm |
| Residual floor thickness: | 70 μm |
| Number of channels: | 31 channels/film (structured width: 21.5 mm) |
| Number of films: | 8 |

Volume of cooler (without connections):

W×L×H (4.9×4.9×0.5 cm$^3$) 12 cm$^3$

Flow quantity of cooling medium: 1.25 L/min

Temperature difference ΔT between CPU and cooling medium inlet:

$$\Delta T = T_{CPU} - T_{cooling\ medium\ inlet}\ [K] 11\ K$$

Temperature difference (for given CPU)/power: 0.157 K/Watts

Compactness (cooling capacity/volume): 5.8 Watts/cm$^3$

Cooling capacity per volume and ΔT: 0.53 Watts/(cm$^3$·K)

Cooling capacity per volume and ΔT and flow: 0.42 Watts/(cm$^3$·K·L/min)

Internal surface area/volume: 4.8 cm$^2$/cm$^3$

| | Innovatec Rev.3 | Inventive cooler (Design A) | Difference |
|---|---|---|---|
| Temperature difference (for given CPU)/power [K/W] | 0.186 | 0.157 | Efficiency improved by 20% |
| Compactness [W/cm$^3$] | 0.8 | 5.8 | 7.5 times smaller |
| Cooling capacity per volume and ΔT and flow | 0.023 | 0.42 | Improvement by a factor of 20 |

The characteristic figures clearly demonstrate that the inventive cooler offers significant advantages in all areas.

The reduction in the temperature difference by approx. 20% effects immediate energy savings in a cooling system and thus effects savings in operating costs. This property is particularly relevant in the case of mainframe computers with a plurality of CPUs, since in this instance several kWatts of heat must be cooled.

Cooling capacity relative to volume, Δ T, and flow is greater by a factor of 20 than for the best market leader and demonstrates that substantially higher packing densities (number of CPUs/volume unit) can be attained with these coolers. It should also be noted that the tubing costs (space required and costs for tubing and couplings) are substantially reduced and this leads to better handling (thin tubing instead of thick tubing).

It should be particularly noted that these characteristic figures apply for a component the size of which is currently adapted to the area of the chip carrier and not the CPU itself for technical assembly reasons and, when directly integrated, could increase even further and thus effect even greater differences from existing technologies.

The channel width, channel depth, channel interval, residual film thickness, and base plate thickness can also be designed application-specific under the following given operating conditions with respect to pressure loss and/or the cited temperature difference and optimized for instance for an AMD 2000+ CPU:

a. Area power of CPU up to 70 Watts/cm$^2$;
b. Difference between the temperatures on the thermal contact surface and in the cooling medium flowing into the cooler of less than 10 K;
c. Flow quantity for the cooling medium through the cooler in the range of 0.01 to 3 L/min;
d. Pressure loss of less than 100 mbar.

In an identical overall system, a water cooler currently available on the market as a substitute attains at best a ΔT (between CPU and cooling medium) in the range of 12.5 and 16 K at a flow quantity of 1–3 L/min and a pressure loss of 25–250 mbar. Under the same conditions, the inventive cooler requires a ΔT between CPU and cooling medium that is at least 30% lower in order to remove the same quantity of heat as the fluid cooler on the market that has heretofore had the best performance. The inventive cooler can be oriented toward and adjusted for the pressure loss of the available or preferred pump via layout and design while assuring sufficient capacity.

The inventive microstructured cooler thus demonstrates substantially higher capacity with a much smaller ΔT. This relationship is exploited for the high degree of scalability in terms of the capacity of the microstructure cooler. In terms of the ratio of interior surface/cooler volume, for the commercial reference cooler this ratio is 1.13 cm$^2$/cm$^3$ and for the inventive prototypes it is 4.8 cm$^2$/cm$^3$, whereby in the inventive prototypes the thickness of the cover plate, currently 1 mm, and the thickness of the side walls, approx. 17 mm, cannot currently be optimized yet due to temporary production engineering reasons. The following values can be expected under industrial production conditions:

Internal surface/cooler volume: approx. 12–15 cm$^2$/cm$^3$
Thickness of the side walls: less than 2 mm The aforesaid values for the operating conditions can be even further optimized in particular when using a water/alcohol mixture, in particular a water/ethylene glycol mixture, and very particularly a mixture of 95 vol. % water and 5 vol. % ethylene glycol as cooling medium.

The following should be observed for the optimal layout of channel width, channel depth, channel interval, residual film thickness, and base plate thickness:

Given previously gained knowledge about the layout of conventional coolers it is assumed that high heat transfer cannot be attained unless there is a turbulent flow in the coolers (high Reynolds' number), since under these conditions a better heat transfer is achieved between cooling medium and cooling channel wall than by adjusting laminar flow ratios. However, this optimizing measure involves a substantial increase in pressure loss.

A very substantial increase in heat transfer capacity by orders of magnitude, relative to the volume of the component, could be attained by using the microstructure engineering for manufacturing coolers and heat exchangers. An example of this is commercial high performance micro-heat exchangers from the Karlsruhe Center for Research. In particular the high costs of microstructure production and the currently very high flow resistances have hindered broad application of microstructure technology in the past.

The reason for the currently very high flow resistances of the known microstructured heat exchangers is that an increase in the heat transfer capacity generally leads with a larger cooler, longer channels, and therefore, due to the Hagen Poiseuille Law, to the increase in the flow resistance, which cannot be tolerated for certain applications, however.

It is only the present invention that resolves this problem without this having a negative impact on the heat transfer capacity, and it does so by making it possible to optimize, even with regard to the pressure loss in the cooler, by optimizing the channel width, channel depth, channel interval, residual film thickness, and base plate thickness.

These measures also make it possible to reduce production costs and therefore also system costs such that microstructure coolers are not only technically superior, but are even economically competitive. The basis for the inventive channel design is that the cross-section of the channels is minimized just enough that a laminar flow is attained in the channels under operating conditions. Turbulences are only tolerated or caused where the flow cross-sections, that is, the flow resistances, are low. In this manner the pressure loss of a product can be adapted to the application at hand in a simple manner. As a rule the first step is to roughly optimize the geometry (channel width, channel depth, and channel interval) within the given ranges by adjusting the surface/volume ratios of the flow channels. A low surface/volume ratio of the microstructure, e.g., 3000 m$^2$/m$^3$ generally means a low flow resistance but also lower heat transfer. At very high values, e.g., 10,000–30,000 m$^2$/m$^3$, the flow resistance climbs sharply so that an optimum is attained preferably at mean surface/volume ratios.

As has been determined, however, optimizing the flow resistance and the surface/volume ratio alone is not sufficient for optimizing capacity. As already explained, in an inventive microstructure cooler the heat source is outside of the component and is removed via the heat-conducting metal structure and by the cooling medium. The result of this is that the physical structure of the cooler must be optimized in addition to optimizing the flow conditions.

The object of the invention is therefore also achieved both by the "hydrodynamic factor," which is responsible for the optimum flow conditions, and by the "structure factor," which is established by the design of the cooler.

The following illustrates the inventive design parameters and their effect on cooling capacity:

It has been determined that with regard to the aforesaid optimizing criteria, pressure loss and temperature difference, it is particularly beneficial to optimize the ratio of channel width to interval between channels (bar width). A ratio that is too high leads to the heat transfer capacity diminishing. Thus this ratio (width/interval) should preferably be in the range of 1.5–2.5:1. A channel width to residual film thickness ratio that is too high has a similar effect. The ratio of channel width/residual film thickness should be 2:1 to 5:1.

Minimizing the residual film thickness furthermore attains improved heat transmission between the individual layers. The following applies for the base plate thickness: Since the temperature of the article to be cooled as a rule is not constant over the surface area, it could at first appear obvious to design the base plate to be thick in order to achieve homogeneous temperature distribution in the cooler. On the other hand, heat transfer for the base plate diminishes as thickness increases due to the heat resistance of the metal used.

Thus there is a heat transfer maximum for the inventive base plate thickness, which thickness can be greater or smaller depending on the (desired) temperature difference or layout. In all of the water coolers currently available on the market, the heat is rapidly removed from the heat source by using the thickest possible base plates (e.g., 5 mm) and thus without taking into account the cited optimum. The inventive cooler has the minimum necessary residual floor thickness for the corresponding capacity range and thus brings the microstructure with the cooling medium as close as possible to the heat source. Thus assured are optimized local heat removal with simultaneous substantial reductions in costs due to savings in materials and reduction in mass.

Thus the parameters for the channel geometry (channel width, depth, and length) affect pressure loss, that is, the "hydrodynamic factor", while the channel interval, residual film thickness, and base plate thickness parameters influence the heat transmission of the three-dimensional structure, that is, the "structure factor." The latter is also highly dependent on the physical arrangement of the channels and flow direction, i.e., the design, as is demonstrated with the design examples presented below. Surprisingly, it has been established that the flow direction in Example 2 plays a very substantial role. The design principle cannot make full use of its advantages unless the fluid is introduced through the gap. Using appropriate design in the inlet area, the central in-flow generates swirling/turbulence that increase the heat transmission immediately above the heat source before the flow finally fully develops. The pressure loss that results from this and the pressure loss that results during the distribution and in-flow into the channels from both sides is compensated by the shortening of the channels and by the doubling of the number of channels compared to design A. Since in accordance with the Hagen Poiseuille law speed is proportional to pressure loss ($\Delta p$) and by doubling the number of channels the flow speed can be cut in half, $\Delta p$ can be reduced by a max. 75% by this and by halving the channel length. The channel has a so-called "critical length" beginning with which the laminar flow developed completely. At first the speed distribution can be described by a nearly rectangular profile. In this case the pressure loss is greater in accordance with the Hagen Poiseuille law, but the heat transmission is higher. The transition point must thus be optimized with the "inlet effect" so that the pressure loss remains minimized in a controlled manner, but the heat transmission is further increased.

Fundamentally, however, the channel lengths should be as short as possible for each design.

Starting at a "critical $\Delta p$" as a minimum, the cooling capacity of the component collapses. This minimum can be intentionally pushed even lower using the described design variations.

Furthermore it has proved advantageous that a heat exchange surface described by the channels in the interior of the cooler is larger than the thermal contact surface on the base plate. For instance, the flow channels in the cooler can form a more or less dense pattern in a metal film and thus define a heat exchange surface in which the heat flowing into the cooler is absorbed by the cooling medium. This heat exchange surface should be larger than the surface on the base plate via which the article to be cooled is in direct thermal contact with the cooler. What this additional optimizing measure achieves is that the heat from the article to be cooled is conducted via the thermal contact surface as directly as possible and completely to the flow channels into the cooling fluid and not for instance into the side walls of the cooler.

Another influencing variable is the aspect ratio of the channels, that is, the ratio of channel depth to channel width. Given the same channel cross-section, deep channels (high aspect ratio) clearly have a positive effect on the heat transmission of the cooler. The aspect ratio in the inventive method depends on the limits of the etching process being used; the maximum achievable figures are currently 1:2 to 1:3.

Using the described design optimizing, an effective transfer of heat from the article to be cooled to the cooler and into the cooling medium can be attained, whereby the pressure loss is adjusted to a reasonable range with the inventive adjustment of the hydrodynamic factor as described in the foregoing. If desired, a pressure loss of 100 mbar or less can be attained with a typical heat transfer capacity of approximately 200 Watts/cm$^2$. Typical characteristic parameters for the cooler are: Flow quantity: 0.01–3 L/min and absolute capacity: 0.02 kWatts–2 kWatts. The power density should be in the range of at least 20 Watts/cm$^2$. CPU/fluid temperature difference is less than 10° C.

Additional design parameters that influence the structure factor and that should be used for optimizing are: total number of channels, number of metal films (channel planes), surface area on the films, surface area in the channels (heat exchange surface area), channel length, type of material comprising the metal films, the base plate, a cover plate for dosing the cooler, and the joining material for the material-fit joining of the metal films to one another and to the base plate, and the selection of the material that is used for creating the thermal contact between the article to be cooled and the cooler.

The inventive cooler contains at least two metal films with flow channels. Preferably the channels are organized into channel planes. Instead of two metal films, it is also possible to use a single metal film and additionally one base plate provided with depressions for receiving flow channels. In this case the one of the two metal films is then called the base plate when it has channels.

The microstructure cooler has preferably 2–10 planes for the channels. With respect to the foregoing, this means that either 1–9 metal films and additionally one base plate provided with channels or 2–10 metal films and additionally one base plate without channels are provided. For a base plate that contains channels, the condition that the residual film thickness is in the range of 50–300 $\mu$m does not apply. The heat transfer capacity from the article to be cooled to the cooling medium increases with the number of channel planes. However, it has been demonstrated that the heat transfer capacity cannot be increased further, or at least cannot be meaningfully increased further, when there are more than 8 layers with the same geometry. Simply varying the number of layers makes it possible to adjust various ranges of heat transfer capacity of the component and also to intentionally influence manufacturing costs. Since each channel plane increases costs, the product must be designed with the application price/capacity ratio in mind. When using the inventive manufacturing process, the price can be very substantially reduced with sufficient cooler capacity when application-specific design reduces surface areas or volume.

In addition to the metal films and the base plate, which closes the stack to the thermal contact surface for the article to be cooled, the inventive microstructure cooler also has a cover plate. The cover plate itself can be a metal film provided with channels. But it can also be an unstructured cover plate. For manufacturing the microstructure cooler, the structured films are provided with a cover plate and a base plate and joined to form a compact component. Preferably a plurality of openings for the connections of the inlet and outlet areas can be preferably etched, punched, or lasered into the cover plate. The cover plate is preferably made of metal, plastic, plastic/injection-molding.

Provided for introducing cooling medium into the cooler and removing cooling medium from the cooler are apparatus for connecting tubes, for instance injected, integrated, or joined connectors. The tube or pipe connecting elements can be directly integrated or variably attachable by screwing on, joining (soldering/brazing), pressing, and/or adhesive. Connected to these connectors are fluid lines to the pumps and/or external countercoolers.

Furthermore, the channels in the metal films generally run parallel to one another. But this does not mean that they must always run in a straight line. Parallel "snake lines", curved or "star-shaped" channels or the like that do not necessarily run parallel to one another can also be advantageous. This makes it possible to arrange the channels extremely close to one another so that very effective heat transfer is attained between the cooler material (metal films) and the cooling medium. Also conceivable is any desired three-dimensional arrangement of the channels in which the individual layers are provided with openings.

Furthermore, the microstructure cooler can have at least one inlet distribution space and at least one outlet distribution space for the cooling medium.

Design A: The distribution spaces can be arranged such that they are situated at side surfaces opposite one another and extend largely across the entire width of that side surface of the cooler.

In the first channel design, the channels connect on the inlet side to an inlet distribution space and on the outlet side to an outlet distribution space. Thus in a cooler structured in this manner cooling medium flows via a first connector into the cooler and then travels into the inlet distribution space. Since the inlet distribution space in this design cuts into all flow channels on one side, the cooling medium can flow from there into the flow channels. Once the cooling medium has traveled through the channels, it reaches the outlet distribution space. From there the cooling medium flows into external cooling lines.

In a second variant, Design B, the metal films are interrupted at approximately the height of the thermal contact surface by at least one inlet-side distribution chamber. For instance, this distribution chamber can separate the metal films as a gap, whereby the metal films are preferably separated vertical to their plane. The gap width can be in the range of 50 to 2,000 $\mu$m, for instance, The gap-shaped distribution chamber can pass through the cooler largely over the entire cross-section vertical to the metal films. If the thermal contact surface is arranged approximately centrally on the base plate, the distribution chamber also separates the metal films approximately in the middle. What this arrangement achieves is that the cooling medium that flows into the distribution chamber from above (when the base plate is below) also comes into contact with the base plate approximately in the central area in which the thermal contact surface is situated. This produces a flow in this area that leads to increased heat transfer.

Since the channels preferably run in the planes of the metal films, all of the channels are connected at their one end to the distribution chamber. In one preferred embodiment, two groups of channels are provided that run essentially parallel to one another. Furthermore provided is at least one collection chamber within the cooler with which all channels are connected at their other end. Two collection chambers can be provided that, as in the case of the first Design A for instance, are arranged on side surfaces opposing one another and that extend essentially across the entire width of each side surface of the cooler. The collection chambers are preferably connected to one another so that cooling medium can travel from the distribution chamber into the cut-in flow channels and from there into the collection chambers that are joined to one another.

In the case of the second Design B, as well, provided are at least one first connector that is connected to the collection chambers, as well as at least one second connector that is connected to the distribution chamber. The cooling medium can thus be conducted out of an external cooling line via the first connector into the distribution chamber and travels from there into the flow channels. The cooling medium is then directed into the collection chambers and from there via the second connector out again into an external cooling line.

For manufacturing the microstructure cooler, methods can be used that are analogous to printed circuit board production methods, these methods comprising the Individual process steps of photolithography, structuring (preferably etching), plating, and joining, preferably soldering (DE 197 08 472 A1). The analogy is that a complex three-dimensional structure is produced by stacking and joining microstructured films. Component design, structure, and joining (solder) system are optimized for this method in terms of the ability for mass production and thus make it possible to manufacture the microstructure coolers in large numbers cost-effectively, whereby existing systems can be used that generally do not have to be modified or only require minor modification. The advantages of the described manufacturing method are the use of already existing microstructuring processes, scalability for industrial mass production, and very low costs. This offers the great advantage that technology that has already proved itself for mass production can be used in a new application for the inventive cooler and furthermore that the process steps can easily be combined and integrated. Thus, for instance for ensuring force-minimized assembly without additional retaining clips, the cooler can be mounted directly onto the CPU, preferably by soldering or adhesive.

For joining the components, the layer thickness of the soldering system and the process parameters must be carefully coordinated with one another in order also to make possible soldering in the laminating presses. Please refer to DE 197 08 472 A1 with regard to possible joining methods.

Figure 3:
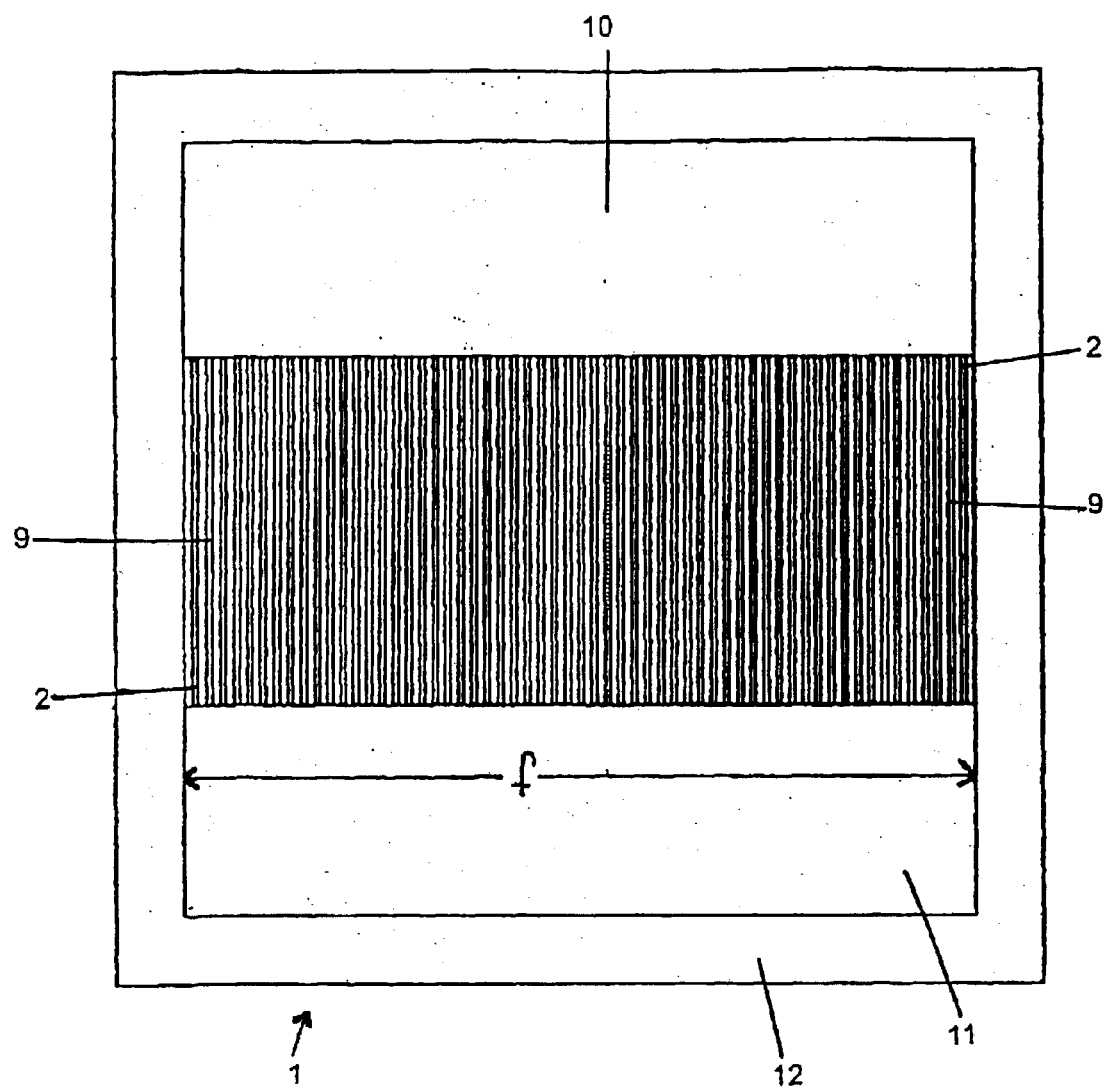
Figure 4:
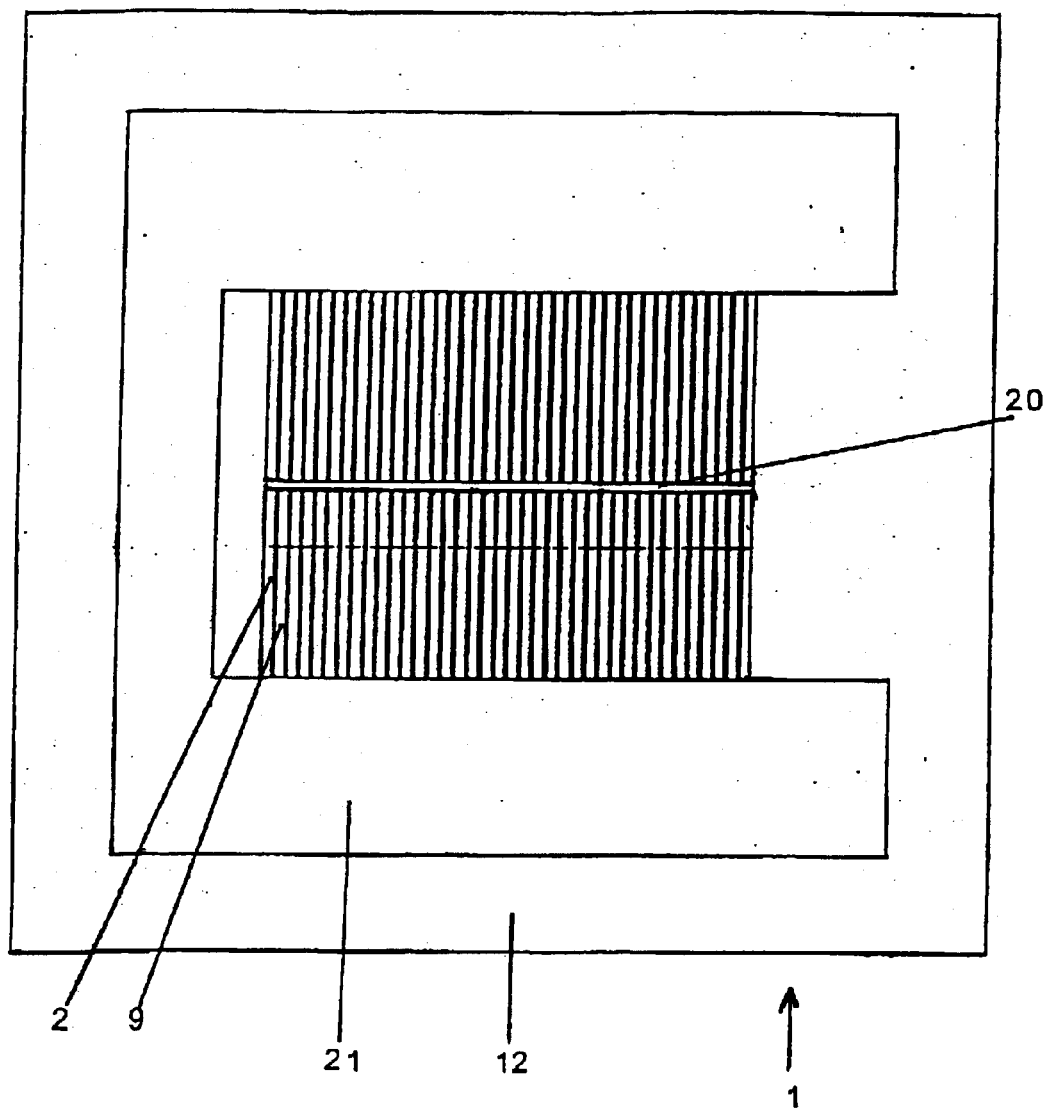
Figure 5A:
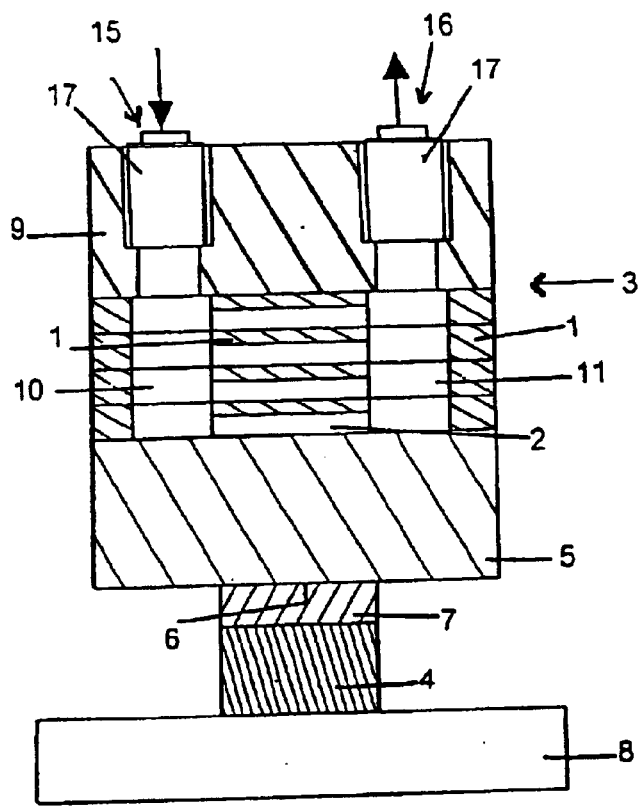
Figure 5B:
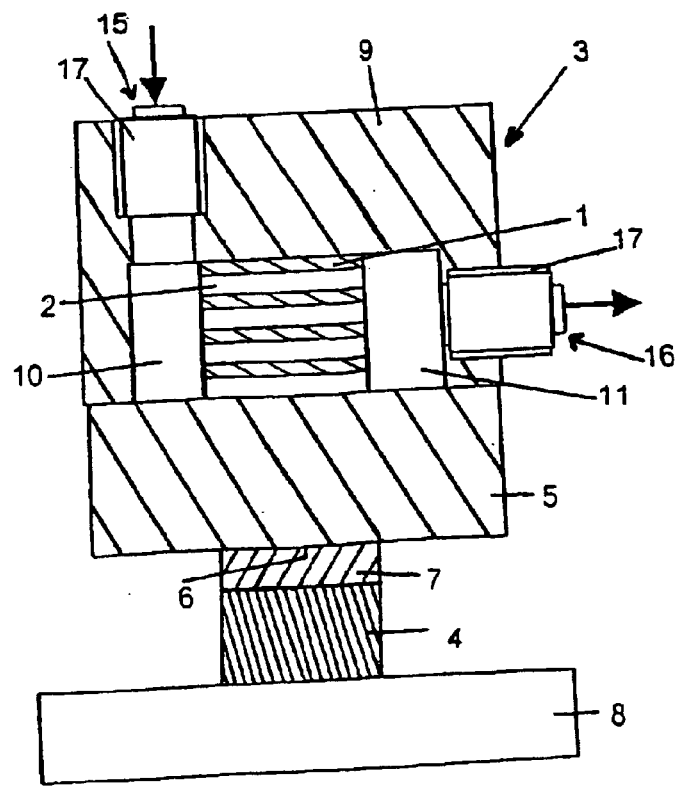
Figure 5C:
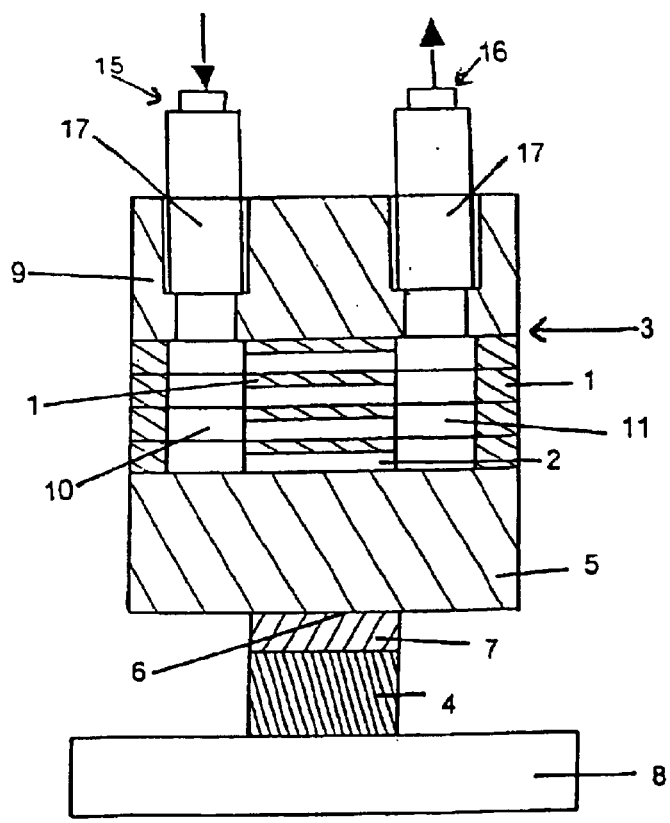
Figure 5D:
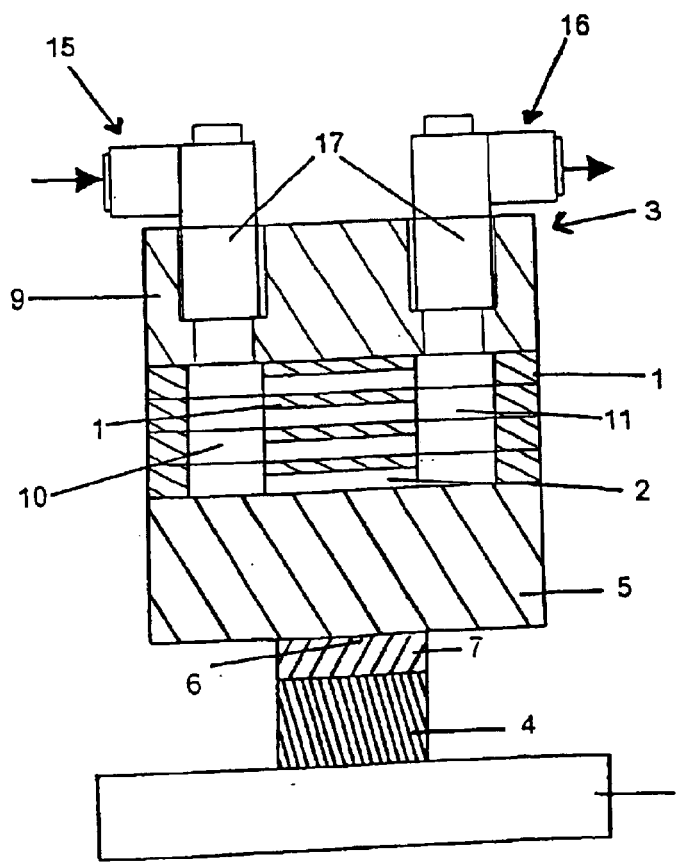
Figure 5E:
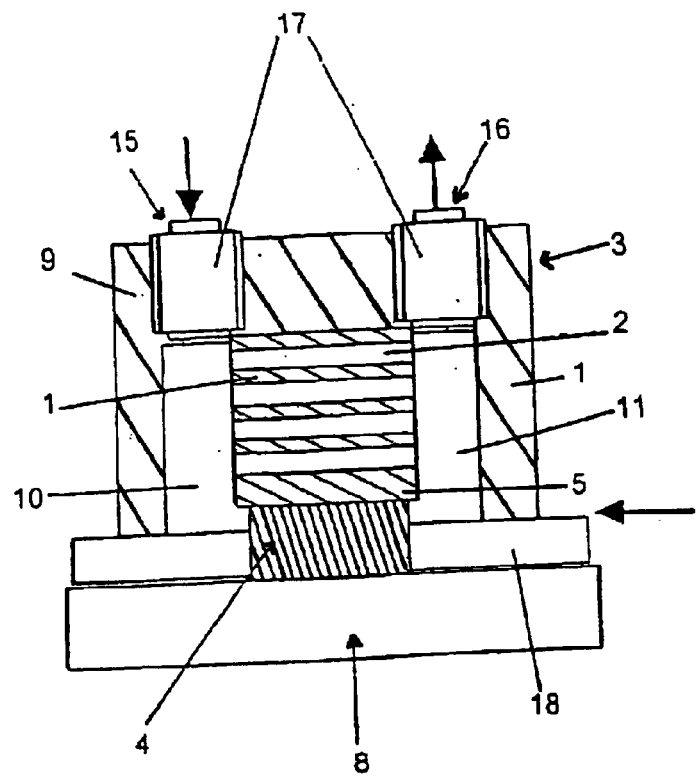
Figure 6:
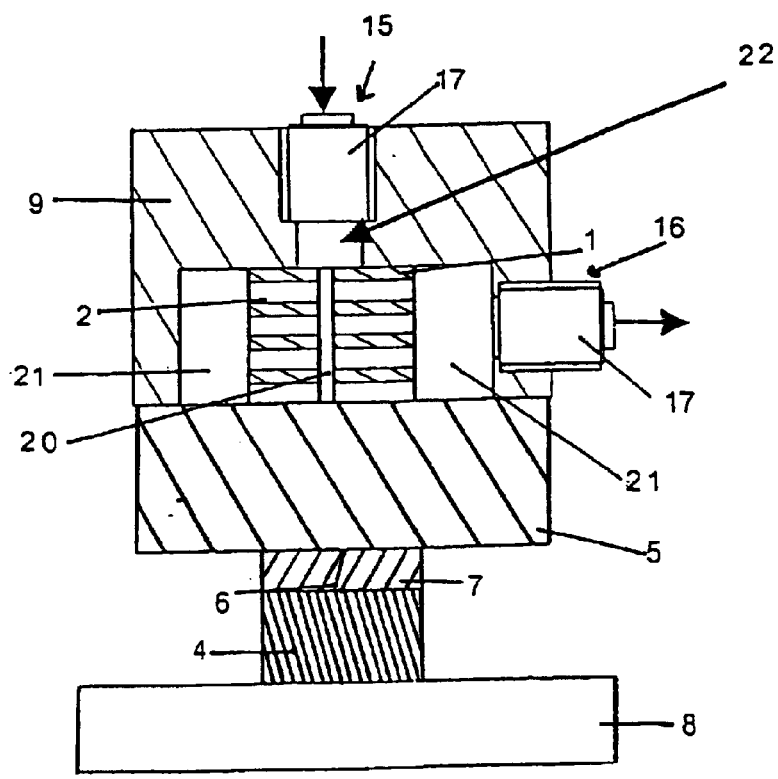

Please refer to the figures for the following explanation of the invention. Illustrated individually are:

FIG. 1: a cross-sectional schematic illustration of a structured metal film;

FIG. 2: a cross-sectional schematic illustration of a microstructure cooler in thermal contact with an electronic element;

FIG. 3: a schematic illustration of a microstructure cooler plane in a first Design A;

FIG. 4: a schematic illustration of a microstructure cooler plane in a second Design B;

FIG. 5a: a schematic illustration of a microstructure cooler in a first Design A with cooling medium connectors pressed in;

FIG. 5b; a schematic illustration of a microstructure cooler in a first Design A with off-set distribution spaces with cooling medium connectors pressed in;

FIG. 5c: a schematic illustration of a microstructure cooler in a first Design A with screw-in cooling medium connectors;

FIG. 5d: a schematic illustration of a microstructure cooler in a first Design A with screw-in, angled cooling medium connectors;

FIG. 5e: a schematic illustration of a microstructure cooler in a first Design A with offset distribution spaces, with a molded cover plate in the shape of a cover, with screw-in cooling medium connectors, and with a base plate that has cooling channels;

FIG. 6: a schematic illustration of a microstructure cooler in a second Design B with cooling medium connectors.

Identical reference numbers have the same meaning in all figures. Please also see the attached key.

FIG. 1 illustrates individual optimizing parameters on a metal film 1 that lead to minimizing the pressure loss in the cooler and to minimizing the temperature difference between thermal contact surface and cooling medium flowing into the cooler or for maximizing cooling capacity. The channels are shown as recesses 2 in the metal film 1 that has not yet been soldered.

Shown are the channel width b, channel depth t, channel interval (bar width) s, and residual film thickness r. Also shown is the width f of the structured area on the metal film 1. FIG. 2 shows the additional optimizing parameter g (base plate thickness).

FIG. 2 illustrates a cooler 3 with thermally contacted CPU processor 4. The cooler 3 in this case comprises four metal films 1, each of which has four cooling channels 2 and bars 9 situated therebetween. The channels 2 of each metal film 1 are closed by an adjacent metal film 1. The cooling channels 2 of the lowermost metal film 1 are closed to the CPU processor 4 by a base plate 5. The base plate 5 also absorbs via a thermal contact surface 6 the heat that the CPU processor 4 develops. For this purpose, the CPU processor 4 is bonded via a joining means with good thermal conductivity (e.g., heat transfer compound, solder, conductive adhesive) 7 to the base plate 5 in the area of the thermal contact surface 6. The CPU processor 4 is mounted on a CPU carrier plate 8. The stack of metal films 1 and base plate 5 is closed by a cover plate 9 situated on top. The base plate thickness g is also shown.

Different designs of the channeling in the microstructure coolers are illustrated in the following:

Design A:

FIG. 3 illustrates a cross-section through a microstructure cooler at the height of one metal film 1. The individual channels 2 in the metal film 1 are shown. The channels 2 are arranged parallel to one another. The parallel arrangement describes a heat exchange surface that is determined by the width f and the channel length and that is larger than the thermal contact surface of the electronic element. This is attained by selecting a sufficiently long length for the channels 2. The channels 2 open to an inlet distribution space 10 and to an outlet distribution space 11. While the channels 2 are situated only in the plane of one metal film 1, the inlet distribution space 10 and the outlet distribution space 11 extend over the entire internal height of the cooler so that the channels 2 of all metal films 1 in the cooler are connected to the two distribution spaces 10, 11.

A plurality of such metal films 1 are soldered to one another, both via the bars 9 of the structured films 1 and via the edge 12 of the film 1. In addition, one of these films 1 is soldered via the bars 9 and the edge 12 to a base plate. The length of the channels 2 is for instance approximately 20 mm when the surface area of a CPU processor to be cooled is 10 mm×10 mm. Thus, a 5-mm overhang of the channels 2 over the thermal contact surface for the CPU processor on each side results in a channel length of 20 mm and a width f of the heat exchange surface area covered by the channels 2 is also 20 mm.

FIG. 5a illustrates a cross-section of a microstructure cooler 3, whereby in this case the connectors for cooling medium that is conducted into and out of the cooler 3 are shown. There is an inlet sleeve 15 and an outlet sleeve 16. For rapid and cost-effective assembly, rapid plug-in connectors 17 are pressed or screwed into the sleeves 15 and 16. This makes it possible to attach a tube, for instance with a diameter of 4 or 8 mm.

FIG. 5b illustrates a cross-section of another microstructure cooler 3. In this case the connecting sleeve 15 and the rapid plug-in connector 17 pressed into this sleeve are located in the area of the cover plate 9. The other connecting sleeve 16 with pressed-in rapid plug-in connector 17 is situated to the side in the cover plate 9 projecting over the channel area.

In this case metal films 1 with cooling channels 2 are used that do not include distribution spaces 10, 11. On the contrary, the metal films 1 have exclusively cooling medium channels 2 that are arranged parallel to one another. By joining a plurality of metal films 1 with channels 2 into a cooling block, the cooling channels open at the ends of the cooling block. This cooling block is assembled with the base plate 5 and the cover plate 9 such that hollow spaces form that are adjacent to the ends of the cooling block and into which the channels 2 open. These hollow spaces form the inlet distribution space 10 and the outlet distribution space 11. The connecting sleeves 15, 16 with the rapid plug-in connectors open directly into the distribution spaces 10, 11. The cover plate 9 can be manufactured cost-effectively as a molded part made of plastic. Since the cooling block is largely reduced to the size of the CPU 4, the manufacturing costs for the cooler 3 can be substantially reduced.

FIG. 5c illustrates another cooler variant. In this case, in contrast to the variant illustrated in FIG. 5a, the rapid plug-in connectors 17 for the inlet sleeve 15 and for the outlet sleeve 16 are embodied as a screw-in connectors. Otherwise this variant corresponds to the embodiment in FIG. 5a.

FIG. 5d illustrates another cooler variant. In this case, in contrast to the embodiment illustrated in FIG. 5c, the rapid plug-in connectors 17 for the inlet sleeve 15 and for the outlet sleeve 16 are embodied in an angled shape. This makes possible an alternative assembly of the tube connectors from the side, so that a lower component height can be attained. Additional advantages are that the tubes can be connected force-free and they are also more easily mounted, even under tighter space constraints. Otherwise this variant corresponds to the embodiment in FIG. 5c.

In another embodiment of the inventive cooler 3, in accordance with FIG. 5e the cover plate 9 is embodied in the form of a cover, for instance made of plastic. This cover 9 can preferably be manufactured by injection molding. The cover includes the area of the cooling block formed by the cooling channels 2 in the metal films 1. Also integrated into the cover 9 are the inlet sleeve 15 and the outlet sleeve 16, which receive rapid plug-in connectors 17 that can be pressed in.

The cooling block comprising the metal films 1 provided with cooling channels 2 has approximately the same size as the CPU 4. The cooling channels 2 in the metal films 1 open into the inlet distribution space 10 and into the outlet distribution space 11. The distribution spaces 10, 11 are immediately connected to the inlet sleeve 15 and the outlet sleeve 16, respectively.

The lowermost metal film 1 of the cooling block is also the base plate. In this case the base plate thickness g satisfies the inventive conditions, i.e., the base plate thickness g is in the range of 200–2,000 $\mu$m. In contrast, the residual film thickness r for this lowermost metal film 1 in which cooling channels 2 are also situated does not necessarily have to be set within the inventive range of 50 to 300 $\mu$m. However, the residual film thickness r for the other metal films is within the inventive range of 50–300 $\mu$m.

The CPU 4 is itself mounted on a carrier plate 8 and is in contact with the cooler 3 via a thermal contact surface 6. The CPU 4 is set on the carrier plate 8 into a recess in an electrical insulating layer 18, for instance protective enamel, and is surrounded thereby, such that the cooler 3 hermetically seals the CPU 4 to the outside.

Design B:

In order to minimize the pressure loss within the microstructured channels 2 and thus to minimize the necessary flow quantity of the cooling medium with respect to optimizing and making smaller the cooler and the entire cooling system, including a cooling medium pump and the fluid tubes, the metal films 1 are interrupted approximately at the height of the thermal contact surface by at least one distribution chamber 20 ("splitted channel design"). In FIG. 4 this distribution chamber 20 is illustrated in one microstructure cooler plane as a gap that cuts into the channels 2 and the bars 9. While the channels 2 are only partially taken out of the metal film 1 illustrated in FIG. 4, the gap 20 is a slit that runs completely through the metal film 1. Overlaying a plurality of such metal films 1 thus forms channels 2 for receiving the cooling medium that run within the metal film plane. The distribution chamber 20 formed by the gap, on the other hand, extends over the entire interior of the cooler.

FIG. 4 further illustrates that the channels 2 open into a collection chamber 21. The collection chamber 21 includes the channel surface area on three sides, so that cooling medium from the distribution chamber 20 can enter the upper channels 2 and the lower channels 2 in the figure. The cooling medium exiting the channels 2 again travels into the U-shaped collection chamber 21. This manner of conducting the cooling medium makes possible excellent cooling capacity. Substantially worse cooling capacity is attained when the cooling medium is conducted in the reverse, that is, when the cooling medium is introduced from the collection chamber 21 into the channels 2, from where the cooling medium travels into the distribution chamber 20.

Just like the distribution chamber 20, the collection chamber 21 is formed in the metal film 1 as a continuous recess, so that once a plurality of such films 1 has been placed one over the other this chamber 21 extends across the entire inner height of the cooler. Just as in the case of the distribution chamber 20, what this achieves is that the cooling medium is distributed uniformly across all channels 2.

For conducting the cooling medium out of the cooler, two connectors can be provided via which the cooling medium is removed from the distribution chambers 20. Once the cooling medium has passed through the channels 2, it travels into the two legs of the collection chamber 21 and is conducted out of the cooler from there.

FIG. 6 is a schematic cross-section of a microstructure cooler 3 with cooling medium connections. In this case, as well, the reference numbers have the same meanings as in the foregoing.

As in FIG. 5b, in this case a structure of the cooler 3 with a cooling block made of metal films 1 and cooling channels 2 arranged therein is illustrated. The cooling block itself is approximately the same size as the thermal contact surface of the CPU 4. Two chambers that form collection chambers 21 result from the cover plate 9 that projects over the channel area in the cooling block and that can preferably be manufactured as an injection molded part made of plastic. These chambers 21 are connected to one another. Furthermore, the metal films are centrally interrupted corresponding to the arrangement in FIG. 4 and thus form a distribution chamber 20 that cuts into the cooling channels 2.

Two connecting sleeves 15 and 16 that receive rapid plug-in connectors 17 are in the cover plate 9. The rapid plug-in connector 17 in the connecting sleeve 15 introduces cooling medium into the cooler 3 and the rapid plug-in connector 16 removes cooling medium from the cooler 3. Tubes can be connected to the rapid plug-in connectors 17. The connecting sleeve 15 opens into a distribution channel 22 that itself opens into the distribution chamber 20.

Key
1 Metal film
2 Channel
3 Microstructure cooler
4 CPU processor
5 Base plate
6 Thermal contact surface
7 Thermal condictive adhesive
8 CPU carrier plate
9 Cover plate
10 Inlet distribution space
11 Outlet distribution space
12 Edge of metal film 1
15 Inlet sleeves
16 Outlet sleeve
17 Rapid plug-in connector
20 Distribution channel
21 Collection chamber
22 Distribution chamber
b Channel width
t Channel depth
s Channel interval
r Residual film thickness
f Width of structured area on the metal film 1
g Base plate thickness

What is claimed is:

1. Microstructure cooler (3) for an article (4) to be cooled, whereby said cooler (3) includes a stack of at least two metal films (1) and one base plate (5) that can be brought via a thermal contact surface (6) into thermal contact with said article (4), said metal films (1) and said base plate (5) are joined to one another in a material fit, present in said metal films (1) are channels (2) for cooling medium, and said channels (2) have a width b in the range of 100 to 2,000 $\mu$m, a depth t in the range of 25 to 1,000 $\mu$m, and a mean interval s in the range of 50 to 1,000 $\mu$m, residual film thicknesses r resulting from said channels (2) in said metal films (1) are in the range of 50 to 300 $\mu$m, and said base plate (5) has a thickness g in the range of 200 to 2,000 $\mu$m.

2. Microstructure cooler in accordance with claim 1, characterized in that said channel width b, said channel depth t, said channel interval s, said residual film thickness r, and said base plate thickness g are optimized such that the pressure loss for the cooling medium in said cooler (3) is minimized.

3. Microstructure cooler in accordance with claim 1, characterized in that said channel width b, said channel depth t, said channel interval s, said residual film thickness r, and said base plate thickness g are optimized such that the difference between the temperature of said thermal contact surface (6) and of the cooling medium flowing in said cooler (3) is minimized.

4. Microstructure cooler in accordance with any one of the preceding claims 1–3, characterized in that said channel width b, said channel depth t, said channel interval s, said residual film thickness r, and said base plate thickness g are adjusted such that a cooling capacity to volume of cooler (3) ratio, i.e., a "compactness", of at least 2 Watts/cm$^3$ is achieved.

5. Microstructure cooler in accordance with any one of the preceding claims 1–3 characterized in that said channel width b, said channel depth t, said channel interval s, said residual film thickness r, and said base plate thickness g are adjusted such that a "cooling capacity per volume and $\Delta$T" of at least 0.1 W/cm$^3$·K) is achieved.

6. Microstructure cooler in accordance with any one of the preceding claims 1–3, characterized in that said channel width b, said channel depth t, said channel interval s, said residual film thickness r, and said base plate thickness g are adjusted such that a specific, pressure loss-normalized cooling capacity of at least 0.1 W/cm$^3$·K·L/min) is achieved.

7. Microstructure cooler in accordance with any one of the preceding claims 1–3, characterized in that said channel width b, said channel depth t, said channel interval s, said residual film thickness r, and said base plate thickness g are adjusted such that a heat transfer capacity of 200 Watts/cm$^2$ is achieved at a maximum difference in temperature between said thermal contact surface (6) and the cooling medium flowing in said cooler (3) of 10 K, at a flow quantity for the cooling medium through said cooler (3) in the range of 0.01 to 3 L/min, and at a pressure loss of at most 100 mbar.

8. Microstructure cooler in accordance with any one of the preceding claims 1–3 characterized in that the ratio of channel width b to mean interval s of channels is in the range of 1.5:1 to 2.5:1.

9. Microstructure cooler in accordance with any one of the preceding claims 1–3 characterized in that the ratio of channel width b to residual film thickness r is in the range of 2:1 to 5:1.

10. Microstructure cooler in accordance with any one of the preceding claims 1–3 characterized in that said width b of said channels is in the range of 200 to 500 μm.

11. Microstructure cooler in accordance with any one of the preceding claims 1–3, characterized in that said depth t of said channels is in the range of 50 to 400 μm.

12. Microstructure cooler in accordance with any one of the preceding claims 1–3, characterized in that said mean interval s of said channels is in the range of 150 to 300 μm.

13. Microstructure cooler in accordance with any one of the preceding claims 1–3, characterized in that said residual film thickness r is in the range of 80 to 120 μm.

14. Microstructure cooler in accordance with any one of the preceding claims 1–3, characterized in that said thickness g of said base plate is in the range of 500 to 1,500 μm.

15. Microstructure cooler in accordance with any one of the preceding claims 1–3, characterized in that a heat exchange surface described by said channels (2) is larger than said thermal contact surface (6).

16. Microstructure cooler in accordance with any one of the preceding claims 1–3, characterized in that said channels (2) in said metal films (1) run largely parallel to one another.

17. Microstructure cooler in accordance with any one of the preceding claims 1–3 characterized in that at least one inlet distribution space (10) and at least one outlet distribution space (1) are provided for the cooling medium.

18. Microstructure cooler in accordance with claim 17, characterized in that all channels (2) connect on the inlet side to said inlet distribution space (10) and on the outlet side to said outlet distribution space (11).

19. Microstructure cooler in accordance with claim 17, characterized in that at least one first connector is provided that is connected to said at least one inlet distribution space (10) and that at least one second connector is provided that is connected to said at least one outlet distribution space (11).

20. Microstructure cooler in accordance with any one of claims 1–3, characterized in that said metal films (1) are interrupted at approximately the height of said thermal contact surface (6) by at least one distribution chamber (20), in that all channels (2) connect at their one end to said at least one distribution chamber (20), and furthermore in that at least one collection chamber (21) is provided within said cooler (3) to which all channels (2) are connected at their other end.

21. Microstructure cooler in accordance with claim 20, characterized in that two groups of channels (2) are provided that run essentially parallel to one another and in that at least one collection chamber (20) is embodied as a gap between said two groups.

22. Microstructure cooler in accordance with claim 21, characterized in that the width of said gap (20) is in the range of 50 to 2,000 μm.

23. Microstructure cooler in accordance with claim 20, characterized in that at least one first connector is provided that is connected to said at least one distribution chamber (20) and in that at least one second connector is provided that is connected to said at least one collection chamber (21).

24. Use of said microstructure cooler in accordance with any of claims 1–3 for cooling electronic elements.

\* \* \* \* \*

UNITED STATES PATENT AND TRADEMARK OFFICE
CERTIFICATE OF CORRECTION

PATENT NO.      : 6,865,081 B2
DATED           : March 8, 2005
INVENTOR(S)     : Meyer et al.

It is certified that error appears in the above-identified patent and that said Letters Patent is hereby corrected as shown below:

Column 1,
Line 16, replace "dock" with -- clock --;
Line 17, delete "is";

Column 5,
Line 1, replace "A part" with -- Apart --;

Column 6,
Lines 18 and 19, replace "pho-otolithographic" with -- photo-lithographic --;

Column 7,
Line 10, insert -- ] -- after "[Watts/cm";
Line 39, insert -- : -- after "power";
Line 44, insert -- : -- after "cooler";
Line 63, insert -- / -- between "cm" and "cm ";

Column 8,
Line 1, insert -- Geometry of the structured films: -- as title of chart;

Column 18,
Line 67, insert -- ( -- between "W" and "/cm K)";

Column 20,
Line 7, replace "(1)" with -- (11) --;
Line 41, insert -- one -- after "any".

Signed and Sealed this

Thirteenth Day of September, 2005

JON W. DUDAS
*Director of the United States Patent and Trademark Office*